(12) United States Patent
Christ

(10) Patent No.: US 7,554,414 B2
(45) Date of Patent: Jun. 30, 2009

(54) FAST STARTING CIRCUIT FOR CRYSTAL OSCILLATORS

(75) Inventor: Volker Christ, Neuss (DE)

(73) Assignee: Infineon Technologies AG, Munich (DE)

( * ) Notice: Subject to any disclaimer, the term of this patent is extended or adjusted under 35 U.S.C. 154(b) by 54 days.

(21) Appl. No.: 11/329,572

(22) Filed: Jan. 11, 2006

(65) Prior Publication Data

US 2006/0170509 A1 Aug. 3, 2006

(30) Foreign Application Priority Data

Jan. 13, 2005 (DE) ........................ 10 2005 001 684

(51) Int. Cl.
*H03L 7/24* (2006.01)
*H03B 5/36* (2006.01)

(52) U.S. Cl. .................... 331/55; 331/1 A; 331/158; 331/183

(58) Field of Classification Search ................. 331/158, 331/1 A, 183, 55
See application file for complete search history.

(56) References Cited

U.S. PATENT DOCUMENTS

| | | | | |
|---|---|---|---|---|
| 4,864,255 A * | 9/1989 | Yoshida | ........................ | 331/75 |
| 5,606,293 A * | 2/1997 | Matsui et al. | .................. | 331/74 |
| 5,805,027 A | 9/1998 | Yin | ............................. | 331/116 |
| 5,834,982 A | 11/1998 | Watanabe et al. | ............ | 331/109 |
| 6,057,742 A | 5/2000 | Prado | ......................... | 331/158 |
| 7,009,458 B2 * | 3/2006 | Gazit | ......................... | 331/158 |
| 7,034,628 B1 * | 4/2006 | Lu et al. | ..................... | 331/158 |
| 2002/0171500 A1 | 11/2002 | Hasegawa et al. | ........... | 331/179 |

FOREIGN PATENT DOCUMENTS

| | | |
|---|---|---|
| EP | 0709965 | 5/1996 |
| WO | 2004/036733 A2 | 4/2004 |

* cited by examiner

*Primary Examiner*—Robert Pascal
*Assistant Examiner*—James E Goodley
(74) *Attorney, Agent, or Firm*—Dicke, Billig & Czaja, PLLC

(57) ABSTRACT

A method for assisting the oscillating starting process of an electromechanical oscillator (10) has the following steps: detection of oscillator oscillations (1*b*, 1*c*) which occur in the output signal (1*a*) from the electromechanical oscillator (10); generation of an excitation pulse (3*b*) on the basis of a detected oscillator oscillation (1*c*); and feeding (3*a*) of the excitation pulse (3*b*) to the electromechanical oscillator (10).

20 Claims, 4 Drawing Sheets

US 7,554,414 B2

FAST STARTING CIRCUIT FOR CRYSTAL OSCILLATORS

PRIORITY

This application claims priority from German Patent Application No. DE 10 2005 001 684.7, which was filed on Jan. 13, 2005, and is incorporated herein by reference in its entirety.

TECHNICAL FIELD

The invention relates to a method and an apparatus for assisting the oscillation starting process of electromechanical oscillators, in particular crystal oscillators.

BACKGROUND

In order to interchange data between different communication terminals, an identical clock or oscillator signal is required for the transmission and reception of data in the subscriber appliances. When interchanging data via radio links, this is generally a radio-frequency clock or oscillator signal (for example at 2 GHz or more). This clock or oscillator signal must be produced in the various communication terminals independently of one another, for which reason the individual clock signals must be highly frequency stable, in order to maintain synchronicity between the subscriber appliances. Thus, in general, electromechanical oscillators, such as oscillating crystals or similar piezoelectric oscillators, are used to produce the stable-frequency clock or oscillator signal.

Crystal oscillators have a high power consumption, which is particularly disadvantageous in battery-powered terminals or terminals which are independent of the mains system, such as mobile telephones, since the comparatively high energy consumption shortens the operating time of such terminals which are independent of a mains system. The oscillating crystals which define the frequency are therefore not generally operated permanently but only at those times at which data is actually being interchanged, or when such an interchange is intended to be possible.

If the intention is just to ensure the capability to interchange data (for example during the standby mode of mobile telephones), then the subscriber appliance is generally briefly switched to reception at regular intervals, for which purpose the radio-frequency clock signal is required. In consequence, the crystal oscillator is likewise switched on for short periods at regular intervals. The radio-frequency clock signal is in this case generally required only for a few milliseconds. However, it must be remembered that the crystal oscillator itself also has an oscillation starting period of several milliseconds.

FIG. 1 illustrates the measured oscillation starting process of a known crystal oscillator. The supply voltage is switched on at t=0, and the oscillating crystal has stabilized after about 4 ms. The radio-frequency clock signal is therefore not available until several milliseconds after the oscillating crystal has been switched on. If the radio-frequency clock signal is likewise required only for a few milliseconds, then the oscillation starting process of the crystal oscillator is lengthened, during which process the radio-frequency clock signal, whose overall operating time is significant, is not yet available. The overall operating time and thus the energy consumption of the crystal oscillator when operated for short periods in this way are governed to a considerable extent by the duration of the oscillation starting process.

SUMMARY

One object of the invention is, thus, to specify a method and an apparatus for assisting or speeding up the oscillation starting process of crystal oscillators. A further object of the invention is to specify an oscillator circuit having an apparatus for assisting the oscillation starting process.

This object can be achieved by a method for assisting the oscillation starting process of an electromechanical oscillator, comprising a feedback method with the following steps:
 a) detecting oscillator oscillations which occur in an output signal from the electromechanical oscillator;
 b) generating an excitation pulse on the basis of a detected oscillator oscillation; and
 c) feeding of the excitation pulse to the electromechanical oscillator.

The detection of the oscillator oscillations may comprise the following steps:
 amplifying oscillator oscillations which occur in the output signal from the electromechanical oscillator; and
 generating a clock signal on the basis of the amplified oscillator oscillations.

The excitation pulse can be generated as a function of an enable signal, with a time at which the enable signal causes the generation of the excitation pulse being predetermined. The enable signal can be produced with the aid of the clock signal. A plurality of excitation pulses can be fed to the electromechanical oscillator, by carrying out the feedback method repeatedly. Groups of excitation pulses can be fed to the electromechanical oscillator periodically, with each group comprising at least one excitation pulse. A predetermined number of excitation pulses can be fed to the electromechanical oscillator within one group of excitation pulses, with the excitation pulses in the groups being generated on the basis of successive, detected oscillator oscillations. No excitation pulses can be fed to the electromechanical oscillator during the time period between the feeding of the groups of excitation pulses. The oscillator oscillations of the electromechanical oscillator which exceed a threshold value can be detected. The electromechanical oscillator may comprise a piezoelectric oscillator, in particular a crystal oscillator.

The object can also be achieved by an apparatus for assisting the oscillation starting process of an electromechanical oscillator, comprising a detection unit for detection of oscillator oscillations which occur in an output signal from the electromechanical oscillator, and a pulse generator for generation of an excitation pulse on the basis of a detected oscillator oscillation which is fed to the electromechanical oscillator.

The detection unit can be designed to amplify oscillator oscillations which occur in the output signal from the electromechanical oscillator, and to generate a clock signal on the basis of the amplified oscillator oscillations. The detection unit may comprise an inverter chain and at least one of the inverters in the inverter chain is operated at the triple point. The first inverter in the inverter chain may detect those oscillator oscillations in the electromechanical oscillator which exceed a threshold value, and this first inverter is in the form of a Schmitt trigger. The pulse generator may comprise a univibrator, and an RC element can be arranged in the delay path of the univibrator. The apparatus may further comprise a unit for production of an enable signal, with the pulse generator being designed to receive the enable signal and feeding the excitation pulse or pulses to the electromechanical oscillator as a function of the enable signal, and a counter which uses the clock signal to determine the time or times at which the enable signal causes the excitation pulse or pulses to be fed to the electromechanical oscillator. The counter can be operable to produce the enable signal with the aid of the clock signal. The unit for production of the enable signal can be designed to cause a plurality of excitation pulses to be fed to the electromechanical oscillator. The unit for production of the enable signal can be designed to cause groups of excitation pulses to be fed to the electromechanical oscillator periodically, with each group comprising at least one excitation pulse. The unit for production of the enable signal can be designed to cause a predetermined number of excitation pulses to be fed to the electromechanical oscillator within one group of excitation pulses, with the excitation pulses in the groups being generated on the basis of successive detected oscillator oscillations. The unit for production of the enable signal can be designed to ensure that no excitation pulses are fed to the electromechanical oscillator during the time periods between the generation of the groups of excitation pulses. The electromechanical oscillator may comprise a piezoelectric oscillator, in particular a crystal oscillator. An oscillator circuit may comprise such an apparatus and an oscillator unit with an electromechanical oscillator. The oscillator unit can be in the form of a Colpitz oscillator.

The method according to the invention for speeding up and assisting the oscillation starting process of an electromechanical oscillator comprises a feedback method. In a first step of the feedback method, voltage variations and oscillator oscillations which occur in the output signal from the electromechanical oscillator are detected. In a second step, a detected oscillator oscillation is used to generate an excitation pulse, which is fed to the electromechanical oscillator in a third step.

Immediately after the supply voltage for the crystal oscillator has been switched on, the crystal oscillator will not yet have been stabilized, but it emits an output signal with voltage variations corresponding to the self-noise of the oscillating crystal, with noise effects and initial oscillations contained in it. These voltage variations are detected in the first step of the feedback method according to the invention. A detected voltage variation is used to produce an excitation pulse, which is emitted to the electromechanical oscillator. The time which passes from detection of a voltage variation to the feeding of the excitation pulse which is produced from it is in general negligible in comparison to the oscillation duration of the electromechanical oscillator. The excitation pulses are thus fed to the electromechanical oscillator instantaneously, on the timescale of the oscillator oscillation, after the detection of a voltage variation or of an oscillator oscillation in the output signal from the electromechanical oscillator. The voltage variation which is detected in the first step of the feedback method is thus amplified with the correct phase. As soon as voltage variations can be detected in the output signal from the electromechanical oscillator, these or the mechanical oscillations of the electromechanical oscillator on which they are based are deliberately amplified by using the instantaneously generated excitation pulses that are fed in to drive additional charges into the electromechanical oscillator. The oscillation amplitude of the voltage variation or of the oscillator oscillation of the electromechanical oscillator is increased in this way.

The method according to the invention deliberately amplifies noise effects and initial oscillations of the electromechanical oscillator, and the oscillation amplitude of the electromechanical oscillator increases considerably faster than in the case of known methods for switching on an electromechanical oscillator. In consequence, the full oscillation amplitude of the electromechanical oscillator, that is to say the steady state, is reached considerably more quickly, and the oscillation starting process is thus significantly shortened. The useable radio-frequency clock or oscillator signal is thus available considerably more quickly after the electromechanical oscillator has been switched on, and the time in which the electromechanical oscillator is not emitting any useable radio-frequency clock signal even though it is consuming power is reduced. The electromechanical oscillator is thus operated in a considerably more energy-saving manner, since the overall operating time of the electromechanical oscillator is reduced. The method according to the invention lengthens the possible operating time of communications terminals which are independent of the mains system.

In one advantageous refinement of the method according to the invention, the detection of the voltage variation or of the oscillator oscillations in the output signal from the electromechanical oscillator comprises the amplification of oscillator oscillations which occur in the output signal from the electromechanical oscillator, and the production of a clock signal on the basis of the amplified oscillator oscillations. The clock signal may in this case be an analogue or else a digital clock signal. A clock signal (initially irregular) is thus formed from the noise and from the initial oscillations of the electromechanical oscillator, from which excitation pulses are subsequently generated for feeding to the electromechanical oscillator.

In a further advantageous refinement of the method according to the invention, the excitation pulses are produced as a function of an enable signal. The enable signal determines whether an excitation pulse is generated on the basis of a detected oscillator oscillation and is then fed to the electromechanical oscillator, and thus predetermines the times at which the generation and feeding of one or more excitation pulse or pulses is caused.

In one preferred refinement, the enable signal is produced with the aid of the clock signal which is emitted from the detection unit. The coupling of the enable signal to the clock signal results in the enable signal being matched to the possibly still irregular clock signal and to the already existing oscillator oscillations.

In a further advantageous refinement of the method according to the invention, the feedback method is carried out repeatedly. In consequence, a plurality of excitation pulses are produced and are fed to the electromechanical oscillator. The plurality of excitation pulses are generated on the basis of a plurality of voltage variations detected, or oscillator oscillations occurring, in the output signal from the electromechanical oscillator, and/or on the basis of the clock signal which is derived from them. The excitation pulses may be generated on the basis of successive clock signals or oscillator oscillations in the output signal from the electromechanical oscillator, or else on the basis of non-successive clock signals, so that an excitation pulse is not fed to the electromechanical oscillator on the basis of each detected voltage variation or oscillator oscillation. There are therefore gaps or pauses between such separated, successive excitation pulses, with these gaps or pauses covering one or more detected oscillator oscillations. The enable signal is advantageously used to control the production of the excitation pulses.

However, the feeding of an excitation pulse to the electromechanical oscillator excites not just the intended oscillation frequency but also harmonics and other undesirable oscillations. The insertion of pauses or gaps between successive excitation pulses allows the undesirable harmonics to decay, and thus contributes to the electromechanical oscillator oscillating only at the intended oscillator frequency. Carrying out the feedback method according to the invention repeatedly results in the oscillation amplitude of the electromechanical oscillator being additionally amplified, and accordingly makes a contribution to further shortening the oscillation starting time.

In a further preferred refinement of the method according to the invention, groups of excitation pulses with a predetermined number of excitation pulses are produced, and are fed to the electromechanical oscillator. The groups comprise at least one excitation pulse. If each of the groups comprises a plurality of excitation pulses, then the excitation pulses in the group are produced on the basis of successive, detected oscillator oscillations or on the basis of separated, non-successive detected oscillator oscillations or clock signals. One group is separated from the previous group and from the subsequent group by a number of detected oscillator oscillations or clock signals, which are not used as the basis for generation and feeding of any excitation pulse. In one particularly preferred refinement, the successive groups of excitation pulses have an identical structure and are separated or spaced apart by an identical number of detected oscillator oscillations, thus resulting in a periodic group structure of excitation pulses.

In a further preferred refinement of the method according to the invention, the only voltage variations and oscillator oscillations that occur in them which are detected and amplified in the output signal from the electromagnetic oscillator are those which exceed a predetermined threshold value. This threshold value is set, for example, such that the detected voltage variations or oscillator oscillations on the basis of which the clock signal is generated can, with a specific confidence level, no longer be added to the (statistical) self-noise of the electromechanical oscillator. By way of example, this threshold value may be in the range between 2 and 10 mV.

In a further preferred refinement of the method according to the invention, the electromechanical oscillator comprises a piezoelectric oscillator, in particular a crystal oscillator or an oscillating crystal.

The apparatus according to the invention for assisting the oscillation starting process of an electromechanical oscillator and for carrying out the method according to the invention comprises a detection unit for detection of oscillator oscillations which occur in the output signal from the electromechanical oscillator and of voltage variations which are present in the self-noise of the electromechanical oscillator and are caused, for example, by noise effects and initial oscillations, as well as a pulse generator for production of an excitation pulse on the basis of a detected oscillator oscillation, which excitation pulse is fed to the electromechanical oscillator. In general, the signal delay times through the detection unit and the pulse generator of the apparatus according to the invention are negligible in comparison to the oscillation duration of the electromechanical oscillator, so that the excitation pulse which is produced on the basis of a detected oscillator oscillation is fed to the electromechanical oscillator instantaneously, on the timescale of the (slower) oscillator oscillation, and thus with the correct phase. This results in additional charges being driven into the crystal, and the oscillation amplitude of the electromechanical oscillator is increased.

In one particularly preferred refinement of the apparatus according to the invention, the detection unit amplifies the voltage variations and oscillator oscillations which occur in the output signal from the electromechanical oscillator, and uses them to generate a clock signal. This clock signal is supplied to the pulse generator. The clock signal thus represents the voltage variations and oscillator oscillations detected in the output signal from the electromechanical oscillator, and can thus be used to produce excitation pulses with the correct phase in the pulse generator.

In one particularly preferred refinement of the apparatus according to the invention, the detection unit comprises an inverter chain for amplification of oscillator oscillations which occur in the output signals from the electromechanical oscillator, and for production of the clock signal. In a further preferred refinement, at least one of the inverters in the inverter chain, but in particular all of the inverters in the inverter chain, is or are operated at the triple point, that is to say the output of the respective inverter is fed back through a high impedance to its input. The input and the output of the inverter thus assume the same voltage level in the rest state, with this being between the two logic voltage levels. The inverter is thus in a state in which it produces the highest gain and can quickly amplify voltage variations which occur. This analogue operation of an inverter, in particular of a CMOS inverter, results in a faster amplifier of simple design.

In a further preferred refinement of the apparatus according to the invention, the first inverter in the inverter chain detects and amplifies only those voltage variations and oscillator oscillations in the electromechanical oscillator which exceed a predetermined threshold value. For this purpose, the first inverter in the inverter chain is preferably in the form of a Schmitt trigger. This means that the only voltage variations which are detected and amplified are those for which, for example, there is a specific confidence level that they cannot be added to the self-noise of the electromechanical oscillator.

In a further preferred refinement of the apparatus according to the invention, the pulse generator comprises a univibrator. The pulse generator receives the clock signal, with the clock signal preferably being in digital form. The univibrator comprises two signal paths, via which signals are supplied to a logic gate. The input signal or the received clock signal is supplied directly to the logic gate via the first signal path. There are an (odd) number of inverters in the second signal path, the delay path, and these have a specific signal delay time (gate delay time). The signal through the delay path thus reaches the logic gate only with a certain delay, with the signal delay time by the inverter chain also governing the pulse duration of the pulse which is emitted at the output of the logic gate. Depending on the nature of the logic gate, a signal pulse is produced at its output when a rising or a falling flank occurs, or on both flanks of the input signal of the univibrator, that is to say of the received clock signal. In one particularly preferred refinement, an RC element which precedes the inverter or inverters is located in the delay path of the univibrator, additionally delays the switching of the inverter or inverters following a flank in the clock signal, and thus additionally governs the pulse duration at the output of the logic gate.

In a further preferred refinement of the apparatus according to the invention, the pulse generator is designed to receive an enable signal, and the apparatus according to the invention also comprises a unit for production of an enable signal. The pulse generator generates the excitation pulse or pulses as a function of the received enable signal. The enable signal thus controls whether an excitation pulse is generated in response to an oscillator oscillation detected in the output signal from the electromechanical oscillator or in response to a flank occurring in the clock signal, and whether this is or is not fed to the electromechanical oscillator.

In a further preferred refinement, the unit for production of the enable signal is in the form of a counter, which determines the times at which the enable signal causes the generation of the excitation pulse or pulses from the clock signal by the pulse generator.

In one particularly preferred refinement of the apparatus according to the invention, the counter is designed to produce the enable signal on the basis of the clock signal which is produced by the detection unit. By way of example, the counter is operated with the aid of the clock signal.

In one particularly preferred refinement of the apparatus according to the invention, the electromechanical oscillator comprises a piezoelectric oscillator and is, in particular, in the form of a crystal oscillator or an oscillating crystal.

The oscillator circuit according to the invention comprises an oscillator unit with an electromechanical oscillator, as well as an apparatus according to the invention for assisting the oscillation starting process of an electromechanical oscillator. The addition of the apparatus according to the invention for assisting the oscillation starting process of an electromechanical oscillator to the known oscillator unit ensures that a stable-frequency clock or oscillator signal is produced even after an oscillation starting period of the electromechanical oscillator which is considerably shorter than that in the prior art.

In one particularly preferred refinement, the oscillator circuit is in the form of a Colpitz oscillator. The electromechanical oscillator is in this case the element of the Colpitz oscillator which determines the frequency.

BRIEF DESCRIPTION OF THE DRAWINGS

The invention will be explained in more detail in the following text with reference to drawing figures and data curves, in which.

DETAILED DESCRIPTION

Figure 1:
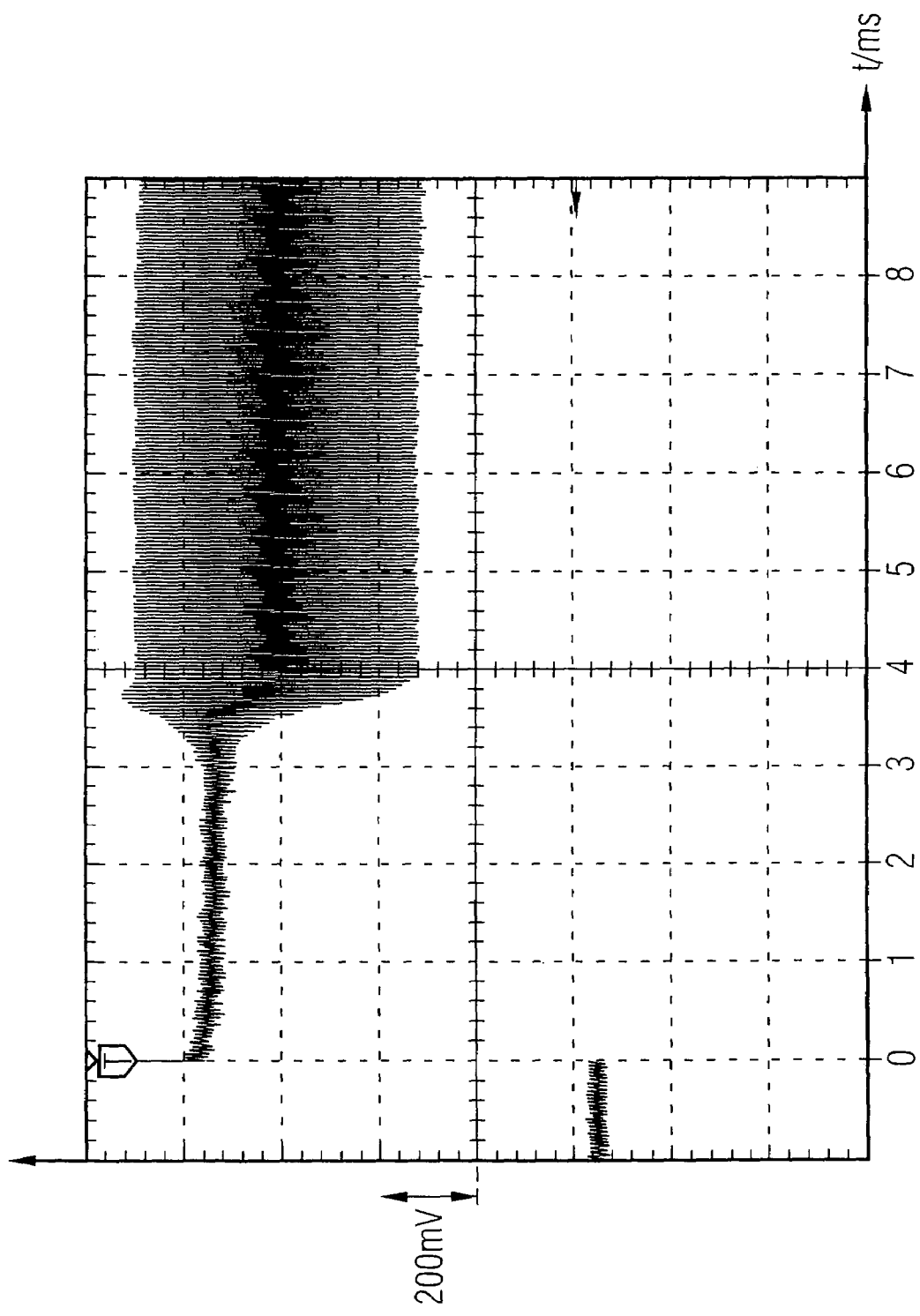
FIG. 1 shows the measured oscillation starting process of an electromechanical oscillator according to the prior art.
Figure 2:
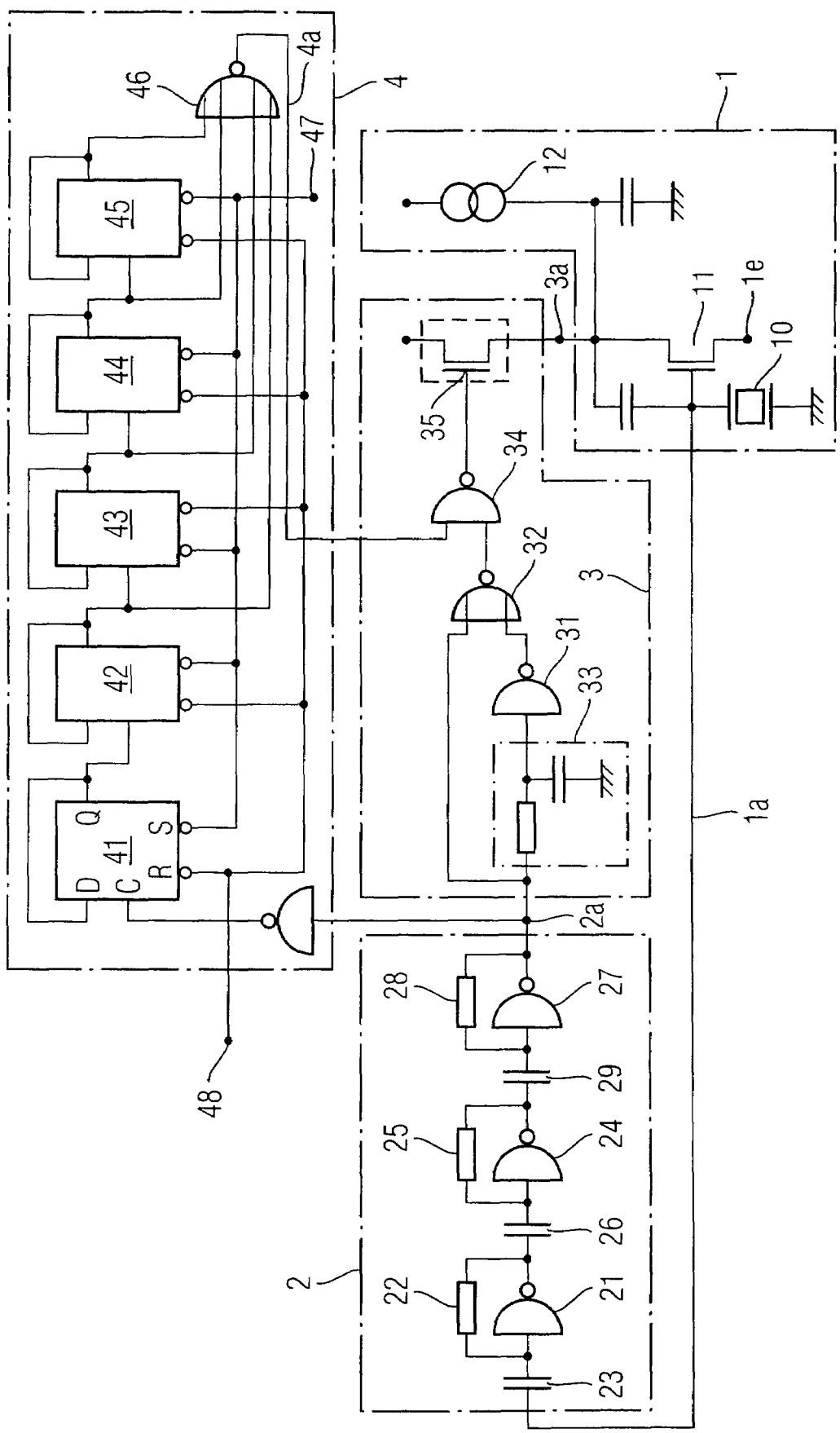
FIG. 2 shows an exemplary embodiment of the apparatus according to the invention.

FIG. 2 shows the circuit diagram of one exemplary embodiment of the oscillator circuit according to the invention. The oscillator circuit comprises an oscillator unit 1 with a crystal oscillator or oscillating crystal 10. A controlled current source 12 supplies a switching transistor 11, whose gate is controlled by the oscillating crystal 10. The controlled current source 12 may be controlled, for example, in such a way that it emits a higher voltage during the oscillation starting process, in order to speed up the oscillation starting process. A stabilized-frequency clock signal is emitted at the connection 1e of the switching transistor. The output signal from the oscillating crystal 10 is supplied via the supply line 1a (XTAL) to a detection unit 2. A pulse generator 3 feeds excitation pulses 3b with the correct phase via the supply line 3a (LOAD PIN) to the oscillator unit 1.

Immediately after the supply voltage for the oscillator unit 1 is switched on, the oscillating crystal 10 has not yet stabilized, and the output signal from the oscillating crystal 10 (on the supply line 1a) essentially contains the self-noise of the oscillating crystal 10 as well as noise effects and initial irregular oscillations, which are detected in the detection unit 2 and are mapped to form a digital clock signal.

In the present exemplary embodiment, the detection unit 2 for this purpose contains an inverter chain comprising three inverters 21, 24, 27, which are DC-isolated from one another and the oscillator unit 1 by means of coupling capacitors 23, 26, 29. The inverters 21, 24, 27 are operated at the so-called triple point, that is to say the output of the inverters 21, 24, 27 is fed back via resistors 22, 25, 28 with a high impedance to the respective input. High-impedance transistors can also be used in each case, instead of the resistors 22, 25, 28. The high-impedance feedback 22, 25, 28 of the individual inverters 21, 24, 27 is designed in such a way that, in the rest state, the voltage at the input and output of an inverter 21, 24, 27 is identical. The resistance value is typically 200 kΩ. The voltage at the input and output is in this case in the middle between the two logic voltage levels, that is to say, if the two logic voltage levels are, for example, 0 and 2.5 V, then the high-impedance feedback for the inverters 21, 24, 27 results in a voltage of 1.25 V being produced at their inputs and outputs. The inverters 21, 24, 27 thus operate as fast amplifiers. When voltage fluctuations occur at the input of the first inverter 21 as a consequence of noise effects, or initial oscillations of the oscillation crystal 10 occur, then these are amplified and are passed to the next inverter 24. If, for example, voltage variations of 10 mV occur at the input of an inverter 21, 24, 27, then these are typically amplified to about 100 mV. The gain is limited by the logic voltage level, which typically at the same time represents the supply voltage for the inverters 21, 24, 27 as well as earth. The detection unit 2 thus emits a digital clock signal 2a, which is produced on the basis of the analogue output signal from the oscillating crystal 10.

The first inverter 21 is preferably in the form of a Schmitt trigger, which amplifies voltage oscillations at the input only above an adjustable threshold value, and preferably has hysteresis in its gain response.

The detection unit 2 thus detects noise effects and oscillator oscillations 1b which occur in the output signal from the oscillating crystal 10, and uses them to form a digital clock signal 2a, which is emitted at the output of the detection unit 2.

The digital clock signal 2a is passed to a counter 4 and to the pulse generator 3.

The pulse generator 3 contains a univibrator 31, 32, which comprises an inverter (flank detector) 31 and a differentiating circuit 32 with whose aid short pulses 3b are produced from the digital clock signal 2a. When a logic 1 is applied to the input of the pulse generator 3, then a logic 0 is produced at the output of the inverter 31. A logic 0 and a logic 1 are thus applied to the inputs of the NOR gate 32, so that the NOR gate 32 emits a logic 0. When the digital clock signal 2a changes to the logic value 0, then a logic 0 is first of all still produced at the output of the inverter 31 (owing to the gate delay time in the inverter 31). A logic 0 is thus applied to both inputs of the NOR gate 32, and the NOR gate 32 emits a logic 1. After the gate delay time of the inverter 31, its output changes to logic 1, and the output of the NOR gate 32 changes back to the logic value 0. The NOR gate 32 thus emits short pulses, whose duration depends on the signal delay time in the delay path. In addition, the inverter 31 is preceded by an RC element 33, which delays the switching of the inverter 31 and further extends the pulse duration at the output of the NOR gate 32.

The output of the NOR gate 32 is connected to one input of a NAND gate 34. The second input of the NAND gate 34 is coupled to a supply line 4a. When the enable signal (logic 1) is applied to the supply line 4a, the pulses which are produced at the output of the NOR gate 32 are passed through the NAND gate 34. The output of the NAND gate 34 changes to the logic value 0 during the pulse duration, and thus opens the gate of a PMOS transistor 35. In consequence, excitation pulses 3b are generated and are emitted via the supply line 3a to the oscillator unit 1 and/or to the oscillating crystal 10. The signal delay time through the detection unit 2 and the pulse generator 3 is governed only by the gate delay times and is thus negligible in comparison to the oscillation duration of the oscillating crystal 10, so that the excitation pulses 3b which are emitted to the oscillating crystal are emitted synchronously in phase with respect to the detected oscillation 1c of the oscillating crystal 10, so that additional charges are driven into the crystal oscillator 10. Noise effects and initial oscillations of the oscillating crystal 10 are amplified instantaneously, and thus in the correct phase.

In the present exemplary embodiment, the counter 4 has five series-connected toggle flipflops 41, 42, 43, 44, 45, which are connected such that they divide the respectively applied clock signal (input C) by a factor of 2. The counter 4 can thus assume $2^5=32$ different states. Each flipflop 41, 42, 43, 44, 45 has a Set-S and a Reset-R input, and the output Q is fed back to the respective data input D. The digital clock signal 2a is applied to the clock input C of the first flipflop 41. The output of the flipflops 41, 42, 43, 44 is applied to the clock input C of the respective subsequent flipflop 42, 43, 44, 45. Furthermore, the output signal Q from the four "higher-value" flipflops 42, 43, 44, 45 is supplied to a NOR gate 46. When a logic 0 is applied to all four inputs of the NOR gate 46, then the enable signal is supplied to the pulse generator 3, in the form of a logic 1 via the supply line 4a. The enable signal is thus emitted to the pulse generator 3 only during the count states 30 and 31 of the counter 4. When the enable signal is not applied to the supply line 4a and a logic 0 is produced there, then the NAND gate 34 blocks the pulses emitted from the NOR gate 32, and no excitation pulses are generated and fed to the oscillating crystal 10. This design of the counter 4 produces three excitation pulses (on changing to the count states 30, 31 and 0) for every 32 detected oscillator oscillations 1b in the output signal from the oscillating crystal 10. However, the design of the counter 4 can be changed as required, so that different excitation pulse sequences are emitted to the oscillating crystal 10. For example, the outputs of the flipflops 41, 42, 43, 44, 45 can be combined as required at the input of the NOR gate 46 in order to emit the desired number and sequence of pulse sequences for each counter run to the oscillating crystal 10. It is also feasible for the number of flipflops 41, 42, 43, 44, 45 to be varied in order to increase or to reduce the number of states of the counter 4. Furthermore, it is also possible to use more complex counters.

The Set-S and Reset-R inputs of the flipflops 41, 42, 43, 44, 45 are controlled via external supply lines 47, 48. The counter 4 and the feeding of the excitation pulses can thus be switched on and off externally.

Figure 3:
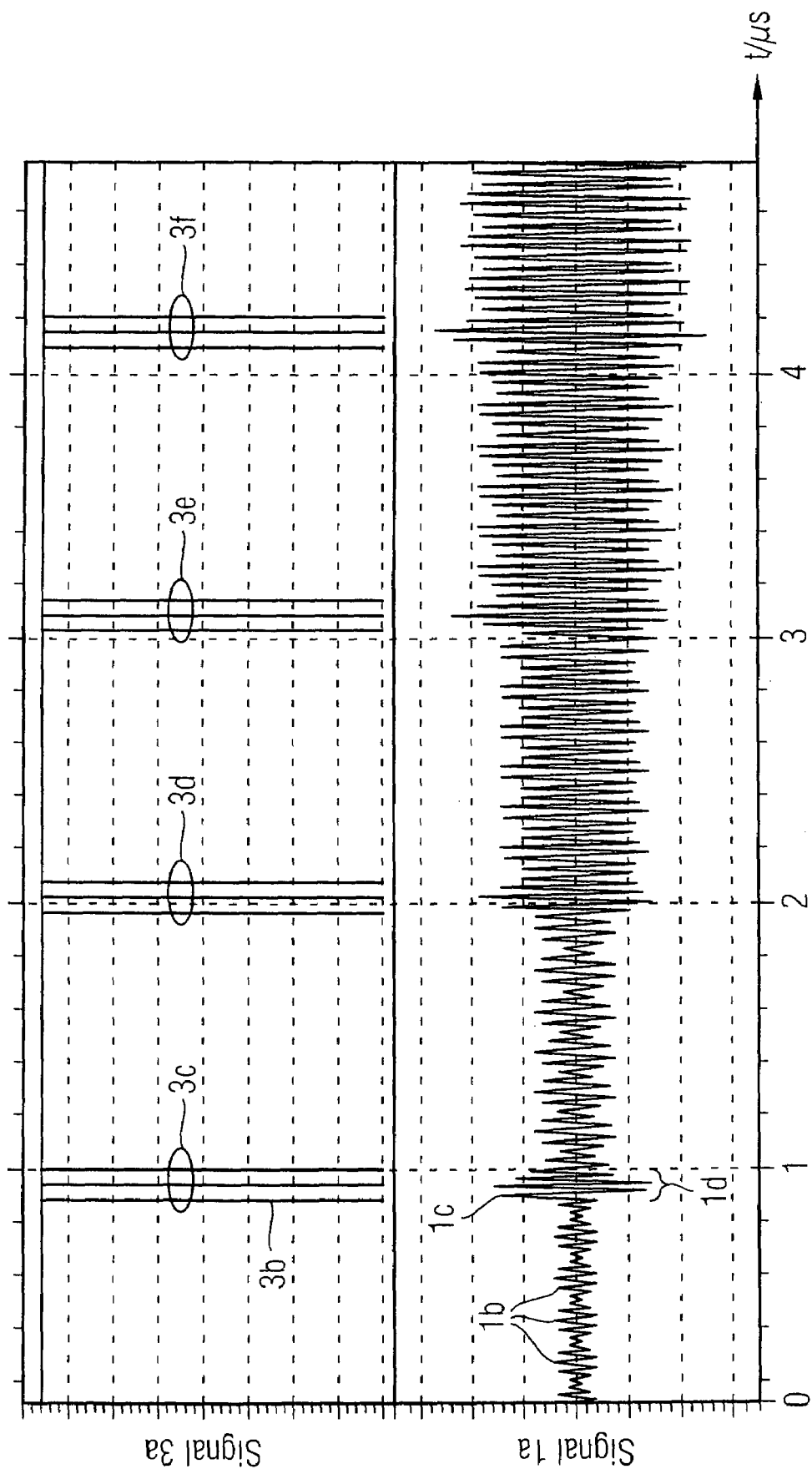
FIG. 3 shows a simulation of the oscillation starting response when using the method according to the invention.

The lower part of FIG. 3 shows a simulation of the output signal 1a (XTAL) from the oscillating crystal 10 when using the method according to the invention. The pulses which are emitted by the pulse generator 3 on the supply line 3a (LOAD PIN) are shown in the upper part of FIG. 3. Three excitation pulses 3c are emitted per cycle of the counter 4, that is to say in the present case with five flipflops 41, 42, 43, 44, 45 per $2^5=32$ for oscillator oscillations 1b detected in the output signal 1a from the oscillating crystal 10. This excitation pulse sequence 3c is repeated with each cycle of the counter 4, and is annotated by the reference symbols 3d, 3e, 3f in FIG. 3. The individual excitation pulses 3b in a pulse sequence 3c correspond to three successive detected oscillator oscillations 1d of the oscillating crystal 10. In the present exemplary embodiment, the oscillation frequency of the oscillating crystal 10 is about 26 MHz, that is to say one counter cycle, which corresponds to 32 oscillator oscillations 1d, lasts for slightly more than 1 µs. As can be seen from the lower part of FIG. 3, the oscillation amplitude of the oscillating crystal 10 increases significantly in each counter cycle, that is to say for every pulse sequence 3c, 3d, 3e, 3f which is emitted, so that the oscillation amplitude of the oscillating crystal 10 has increased considerably even after a few microseconds and after a small number of excitation pulses 3b have been fed to the crystal oscillator 10.

An oscillation frequency of about 26 MHz corresponds to an oscillation duration of about 38 nanoseconds, while the signal delay time through the detection unit 2 and the pulse generator 3 is in the region of 1 nanosecond. The excitation pulses are thus fed to the crystal oscillator 10 with a delay which is negligible in comparison to the oscillation duration and is thus sufficiently in the correct phase.

Figure 4:
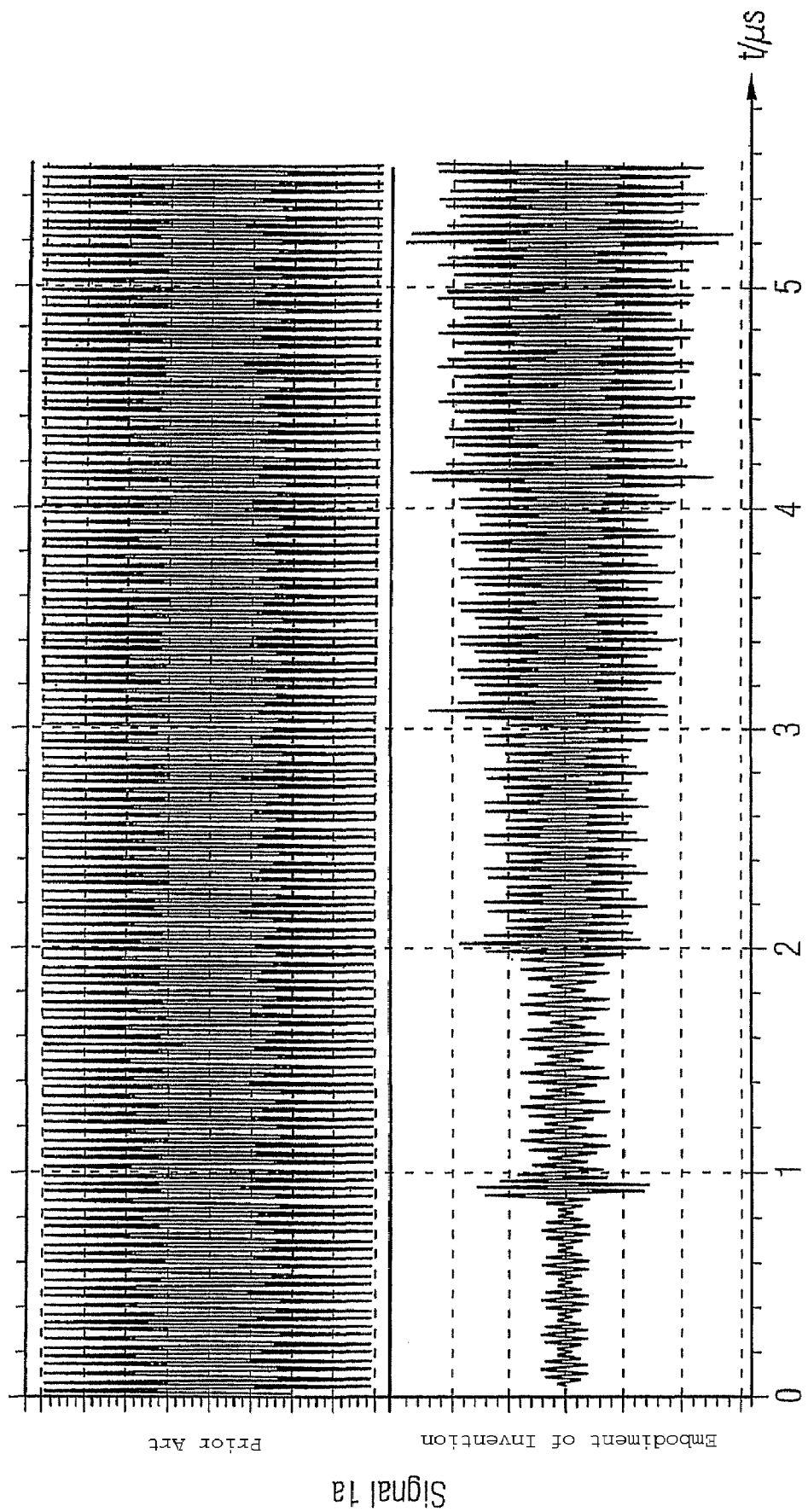
FIG. 4 shows a comparison of the oscillation starting response which results from the use of the method according to the invention, with the known oscillation starting response.

FIG. 4 shows a comparison of the oscillation starting processes of an oscillating crystal 10 according to the prior art (upper part) and that of an oscillating crystal 10 when using the method according to the invention (lower part). As has already been mentioned above, the oscillator amplitude of the oscillating crystal 10 rises considerably within a few microseconds when using the method according to the invention. In comparison, the oscillator amplitude of the oscillating crystal 10 rises only slightly in the same time period when the oscillations are started according to the prior art (the scaling of the graph in the upper part of FIG. 4 is irrelevant in this case).

After the end of the oscillation starting process, that is to say as soon as the oscillation of the oscillating crystal 10 has risen above a specific amplitude, the detection unit 2, the pulse generator 3 and the counter 4 are switched off.

What is claimed is:

1. A method for assisting the oscillation starting process of an electromechanical oscillator, comprising a feedback method with the following steps:
   a) detecting oscillator oscillations which occur in an output signal from the electromechanical oscillator;
   b) generating an enable signal during an oscillation of the oscillator;
   c) generating an excitation pulse on the basis of a detected oscillator oscillation and the enable signal;
   d) feeding of the excitation pulse to the electromechanical oscillator; and
   e) determining, with a counter which uses a clock signal, the time or times at which the enable signal causes the excitation pulse or pulses to be fed to the electromechanical oscillator,
   wherein a plurality of excitation pulses are fed to the electromechanical oscillator, by carrying out the feedback method repeatedly,
   wherein groups of excitation pulses are fed to the electromechanical oscillator periodically, with each group comprising at least one excitation pulse,
   wherein no excitation pulses are fed to the electromechanical oscillator during the time period between feeding of the groups of excitation pulses,
   wherein the time period between feeding of the groups of excitation pulses is longer than the time period between two subsequent pulses in any group of excitation pulses.

2. A method according to claim 1, wherein the detection of the oscillator oscillations comprises the following steps:
   amplifying oscillator oscillations which occur in the output signal from the electromechanical oscillator; and
   generating a clock signal on the basis of the amplified oscillator oscillations.

3. A method according to claim 1, wherein a time at which the enable signal causes the generation of the excitation pulse is predetermined.

4. A method according to claim 1, wherein the enable signal is produced with the aid of the clock signal.

5. A method according to claim 1, wherein a predetermined number of excitation pulses are fed to the electromechanical oscillator within one group of excitation pulses, with the excitation pulses in the groups being generated on the basis of successive, detected oscillator oscillations.

6. A method according to claim 1, wherein the oscillator oscillations of the electromechanical oscillator which exceed a threshold value are detected.

7. A method according to claim 1, wherein the electromechanical oscillator comprises a piezoelectric crystal oscillator.

8. An apparatus for assisting the oscillation starting process of an electromechanical oscillator, comprising:
 a detection unit for detection of oscillator oscillations which occur in an output signal from the electromechanical oscillator;
 a unit for production of an enable signal during an oscillation of the oscillator;
 a pulse generator operable to receive the enable signal and to generate an excitation pulse on the basis of a detected oscillator oscillation which is fed to the electromechanical oscillator on the basis of the enable signal; and
 a counter which uses a clock signal to determine the time or times at which the enable signal causes the excitation pulse or pulses to be fed to the electromechanical oscillator,
 wherein the unit for production of the enable signal is operable to cause a plurality of excitation pulses to be fed to the electromechanical oscillator,
 wherein the unit for production of the enable signal is operable to cause groups of excitation pulses to be fed to the electromechanical oscillator periodically, with each group comprising at least one excitation pulse,
 wherein the unit for production of the enable signal is operable to ensure that no excitation pulses are fed to the electromechanical oscillator during the time periods between the generation of the groups of excitation pulses
 wherein the time period between feeding of the groups of excitation pulses is longer than the time period between two subsequent pulses in any group of excitation pulses.

9. An apparatus according to claim 8, wherein the detection unit is operable to amplify oscillator oscillations which occur in the output signal from the electromechanical oscillator, and to generate a clock signal on the basis of the amplified oscillator oscillations.

10. An apparatus according to claim 8, wherein the detection unit comprises an inverter chain and at least one of the inverters in the inverter chain is operated at the triple point.

11. An apparatus according to claim 10, wherein the first inverter in the inverter chain detects those oscillator oscillations in the electromechanical oscillator which exceed a threshold value, and this first inverter is in the form of a Schmitt trigger.

12. An apparatus according to claim 8, wherein the pulse generator comprises a univibrator, and an RC element is arranged in the delay path of the univibrator.

13. An apparatus according to claim 8, wherein the counter is operable to produce the enable signal with the aid of the clock signal.

14. An apparatus according to claim 8, wherein the unit for production of the enable signal is operable to cause a predetermined number of excitation pulses to be fed to the electromechanical oscillator within one group of excitation pulses, with the excitation pulses in the groups being generated on the basis of successive detected oscillator oscillation.

15. An apparatus according to claim 8, wherein the electromechanical oscillator comprises a piezoelectric crystal oscillator.

16. An oscillator circuit comprising:
 an oscillator unit with an electromechanical oscillator configured to provide an output signal;
 a detection unit configured to detect oscillator oscillations which occur in the output signal from the electromechanical oscillator;
 a unit configured to produce an enable signal during an oscillation of the oscillator;
 pulse generator configured to receive the enable signal and generate an excitation pulse based on a detected oscillator oscillation which is fed to the electromechanical oscillator based on the enable signal; and
 a counter which uses a clock signal to determine the time or times at which the enable signal causes the excitation pulse or pulses to be fed to the electromechanical oscillator,
 wherein the unit configured to produce the enable signal is operable to cause a plurality of excitation pulses to be fed to the electromechanical oscillator,
 wherein the unit configured to produce the enable signal is operable to cause groups of excitation pulses to be fed to the electromechanical oscillator periodically, with each group comprising at least one excitation pulse,
 wherein the unit configured to produce the enable signal is operable to ensure that no excitation pulses are fed to the electromechanical oscillator during the time periods between the generation of the groups of excitation pulses,
 wherein the time period between feeding of the groups of excitation pulses is longer than the time period between two subsequent pulses in any group of excitation pulses.

17. An oscillator circuit according to claim 16, wherein the oscillator unit is in the form of a Colpitz oscillator.

18. A method for assisting the oscillation starting process of an electromechanical oscillator, comprising a feedback method comprising:
 a) detecting oscillator oscillations which occur in an output signal from the electromechanical oscillator;
 b) generating an excitation pulse based on a detected oscillator oscillation;
 c) feeding of the excitation pulse to the electromechanical oscillator synchronously in phase with respect to the detected oscillator oscillation; and
 d) determining, with a counter which uses a clock signal, the time or times at which the excitation pulse or pulses is fed to the electromechanical oscillator,
 wherein a plurality of excitation pulses are fed to the electromechanical oscillator, by carrying out the feedback method repeatedly,
 wherein groups of excitation pulses are fed to the electromechanical oscillator periodically, with each group comprising at least one excitation pulse,
 wherein no excitation pulses are fed to the electrotmechanical oscillator during the time period between feeding of the groups of excitation pulses,
 wherein the time period between feeding of the groups of excitation pulses is longer than the time period between two subsequent pulses in any group of excitation pulses.

19. An apparatus configured to assist the oscillation starting process of an electromechanical oscillator, comprising:
 a detection unit configured to detect oscillator oscillations which occur in an output signal from the electromechanical oscillator;

a pulse generator configured to generate an excitation pulse based on a detected oscillator oscillation which is fed to the electromechanical oscillator synchronously in phase with respect to the detected oscillator oscillation; and a counter which uses a clock signal to determine the time or times at which the excitation pulse or pulses is fed to the electromechanical oscillator, wherein a plurality of excitation pulses are fed to the electromechanical oscillator, wherein groups of excitation pulses are fed to the electromechanical oscillator periodically, with each group comprising at least one excitation pulse, wherein no excitation pulses are fed to the electromechanical oscillator during the time period between feedine of the groups of excitation pulses wherein the time period between feeding of the groups of excitation pulses is longer than the time period between two subsequent pulses in any group of excitation pulses.

20. A method for assisting the oscillation starting process of an electromechanical oscillator, comprising a feedback method comprising:

a) detecting oscillator oscillations which occur in an output signal from the electromechanical oscillator;
b) generating an enable signal during an oscillation of the oscillator;
c) generating an excitation pulse sequence having a predetermined number of excitation pulses based on a detected oscillator oscillation and the enable signal; and
d) feeding the excitation pulse sequence to the electromechanical oscillator, wherein a plurality of excitation pulses are fed to the electromechanical oscillator, by carrying out the feedback method repeatedly, wherein groups of excitation pulses are fed to the electromechanical oscillator periodically, with each group comprising at least one excitation pulse, wherein no excitation pulses are fed to the electromechanical oscillator during the time period between feeding of the groups of excitation pulses, wherein the time period between feeding of the groups of excitation pulses is longer than the time period between two subsequent pulses in any group of excitation pulses.

* * * * *

UNITED STATES PATENT AND TRADEMARK OFFICE
CERTIFICATE OF CORRECTION

PATENT NO. : 7,554,414 B2 Page 1 of 1
APPLICATION NO. : 11/329572
DATED : June 30, 2009
INVENTOR(S) : Volker Christ It is certified that error appears in the above-identified patent and that said Letters Patent is hereby corrected as shown below:

Front Page, Foreign Application Priority Data, delete "10 2005 001 684" and insert in place thereof --10 2005 001 684.7--.

Column 11, line 57, delete "an" and insert in place thereof --a--.

Column 12, line 12, delete "pulse generator" and insert in place thereof --a pulse generator--.

Signed and Sealed this

Ninth Day of March, 2010

David J. Kappos
*Director of the United States Patent and Trademark Office*